(12) United States Patent
Graham

(10) Patent No.: US 11,523,528 B2
(45) Date of Patent: Dec. 6, 2022

(54) FLEXIBLE CIRCUIT SWITCHING AND PROTECTION DEVICE

(71) Applicant: Eric Graham, Bellingham, WA (US)

(72) Inventor: Eric Graham, Bellingham, WA (US)

(*) Notice: Subject to any disclaimer, the term of this patent is extended or adjusted under 35 U.S.C. 154(b) by 0 days.

(21) Appl. No.: 17/367,981

(22) Filed: Jul. 6, 2021

(65) Prior Publication Data

US 2022/0007532 A1 Jan. 6, 2022

Related U.S. Application Data

(60) Provisional application No. 63/048,491, filed on Jul. 6, 2020.

(51) Int. Cl.
*H05K 5/03* (2006.01)
*H05K 5/00* (2006.01)
*H05K 5/02* (2006.01)
*H05K 1/18* (2006.01)

(52) U.S. Cl.
CPC ............ *H05K 5/03* (2013.01); *H05K 5/0008* (2013.01); *H05K 5/0013* (2013.01); *H05K 5/0247* (2013.01); *H05K 1/189* (2013.01)

(58) Field of Classification Search
CPC ...................................................... H05K 5/00
See application file for complete search history.

(56) References Cited

U.S. PATENT DOCUMENTS 9,793,028 B2 * 10/2017 Nakayama ............. H01G 11/10
2015/0349523 A1 * 12/2015 Tsovilis ................... H02H 9/06
361/56

* cited by examiner

*Primary Examiner* — Jerry Wu
(74) *Attorney, Agent, or Firm* — White-Welker & Welker, LLC; Matthew T. Welker, Esq.

(57) ABSTRACT

A flexible electrical system distribution, switching, and protection solution having two or more autonomous electrical switching devices and optionally adding circuit protection and manual switching in one self-contained device. A printed circuit board assembly is configured to operate two or more electrical switch functions to act from a remote signal input or autonomously, independently or simultaneously. The printed circuit board can be assembled into a housing where multiple independent circuits on the printed circuit board assembly can be permanently electrically connected to each other through electrical conductors thus reducing the number of independent circuits within the assembly. The assembly further consists of an electrically isolative housing and terminal studs and retaining nuts capable to receiving electrical cable ring terminals.

21 Claims, 18 Drawing Sheets

FLEXIBLE CIRCUIT SWITCHING AND PROTECTION DEVICE

FEDERALLY SPONSORED RESEARCH

Not Applicable

SEQUENCE LISTING OR PROGRAM

Not Applicable

TECHNICAL FIELD OF THE PRESENT INVENTION

The present invention relates to marine and emergency vehicle electrical systems. More specifically, the present invention relates to the primary electrical systems of marine and emergency vehicles and the autonomous electrical switching devices therein for controlling the availability of power to all installed components, adjusting draws based on charge and charging conditions as well as being able to communicate with all installed components in order to receive input on whether to turn on or wait to shut down the power to some or all installed devices.

BACKGROUND OF THE PRESENT INVENTION

Mobile electrical systems such as marine vessels and motor vehicles typically utilize a chemical battery for providing electrical power to on board devices needed to operate the vehicle or vessel. In many applications the vehicle or vessel contains an engine that uses the battery power to start and in turn provides power back to the battery. Marine vessels are often constructed with two or more batteries or sets of batteries (banks) that can operate independently of each other. Vessels with two or more engines often have separate starting batteries for each engine. Most vessels over 18 feet in length have a separate battery for supporting non-engine starting electrical loads, often terms a "house" battery and supplying electricity to radios, lights, navigation and communications equipment.

The nature of the marine and other motor vehicle industries such as emergency responder vehicles (police, ambulance, fire) is to provide for redundancy in order to maximize the ability for the vehicle or the vessel to be is effective operational condition. This is the primary reason why separate battery systems are typically utilized. Similarly, these vehicles or vessels often utilize redundant methods to maintain battery charge through multiple engines or separate charging methods such as "shore" AC plug-in-based battery chargers, solar panels, or wind generators. On the electrical loads placed within the vehicles or vessels, maximizing system availability often dictates isolation of electrical load groups in order to ensure that a critical group of devices is able to receive priority over less critical electrical loads should there be a shortage of electrical power on the vehicle or vessel.

The primary electrical systems of marine vessels and many motor vehicles are therefore often complex in nature and consequently require devices that are able to connect or disconnect the various power and charging sources such as batteries and battery charging devices from the various electrical loads within the system such as engine starters, house lighting, and navigation/communications equipment. The marine and emergency vehicle industries have long utilized manual means for providing operator determination of which batteries and loads are turned on or off or connected to each other using human controlled mechanical battery disconnect switches, remote electro-mechanical relays, or silicon switching devices. These solutions worked well especially with the simple battery and electrical load configurations that were prevalent in the past.

More recently the electrical system complexity driven by increased safety requirements and increased number of battery charging sources and electrical load devices has driven interest and utilization of automatic methods for connecting and disconnecting the various primary elements described above. Devices described as voltage sensitive relays or automatic charging relays have taken over the function of autonomously connecting and disconnecting separate battery banks when a charge source is or is not present. Other devices described as low voltage disconnects, battery savers, or timed disconnects provide the functionality of disconnecting electrical loads when batteries are at a low state of charge.

The proliferation of autonomous electrical switching devices has simplified operation of these systems but has introduced other challenges for system designers and operators in a world where the space available to install and maintain these devices is increasingly being limited in order to maximize space for other equipment or end user storage. Moreover, each individual autonomous electrical switching device requires a minimum amount of electrical energy in order to continuously monitor inputs and outputs through sensors and make intelligent decisions.

When added up, the many individual devices can easily drain a battery over a fairly short period of time if the vehicle or vessel is not operated and left without an active battery charge source applied. Finally, each individual switching device carries the cost of a microprocessor, control input/output connections, and external high ampere connections many of which ultimately connect to another autonomous switching device.

Mobile electrical systems also require electrical wires connected to the battery power source be protected for over-current events that may occur, which could cause smoke or fire from wire insulation temperature rating. Circuit protection devices such as fuses or circuit breakers are commonly used to protect electrical wires. Vehicle electrical systems architecture typically employ multiple circuit protection devices in a single "block" electrically downstream from circuit switching devices. The installer must fabricate electrical connections between the output of switching devices and the input of circuit protection blocks.

As part of installing electrical equipment in vehicles or vessels, a frequent approach for an installer is to install a manually operable circuit breaker in a location that is convenient for the end user or a technician to operate. Some installers connect a circuit breaker close to the battery power source in which case the circuit breaker provides the value of protecting the downstream wire along with the function of being able to disconnect power to the circuit.

However, many installers choose to utilize factory supplied power distribution points for connecting their additional electrical components. These factory-installed connection points typically have circuit protection provided by the vehicle manufacturer near the battery in fuse boxes. This result in the fact that the circuit breakers used by installers connecting to factory connection points are redundant for protecting circuits from overcurrent events and are only beneficial for disconnecting the power to installed devices.

Circuit protection devices are designed to automatically protect electrical circuits from overcurrent by self-inducing internal heat within the device and "opening" the circuit should current exceed specified limits for a period of time. Circuit breakers introduce internal heat by creating electrical resistance within the device. The result of increased electrical resistance within the electrical system is increased voltage drop between the voltage supplied by the battery and the components installed in the vehicle. Reducing the voltage drop at the end components can cause deleterious effects on component operation and/or life expectancy.

Therefore, using circuit breakers as a disconnect switch for incremental electrical components added from a connection point that is provided by the vehicle manufacturer and is already protected by fuses, has the effect of adding unnecessary costs and unnecessary detrimental system voltage drop. The lower the voltage at the component, the more likely the component will not operate especially if the battery voltage is abnormally low for any of a multitude or reasons.

Mobile electrical systems also consist of a multitude of components that can operate autonomously with a high level of intelligence but also which would benefit from being interconnected with other intelligent electrical systems as well as the vehicle manufacturer's intelligent systems. With a multitude of complex electrical systems being installed on vehicles, it is imperative that the vehicle battery power be preserved for the critical act of starting the engine in order for the engine alternator to ensure the battery power remains at an optimum level. Even if each electrical component were to actively monitor when it should shut down or allow active use, the growing number of installed components incrementally drain battery power through the need to actively monitor vehicle status when the vehicle is off.

What is needed is a single device that (a) controls the availability of power to all installed components, (b) draws a very low amount of power when the electrical system has no active charging source, and (c) is able to communicate with all installed components in order to receive input on whether to turn on or wait to shut down the power to some or all installed devices.

It is apparent that a need exists for a novel solution to provide a smaller more cost effective solution to provide primary electrical system autonomous or manual switching where two or more functions can be combined to reduce device interconnection space and cost and leverage processing power across multiple functions. Also, adding the ability to offer manual on/auto/off control of such a device would further improve system performance, reduce costs, space, and time to install.

Moreover, the ability to communicate with vehicle information systems and other incremental devices added to vehicles by $3^{rd}$ party installers would solve growing power dissipation challenges and provide significant opportunities to improve system performance through the sharing of information between devices. The present invention is directed toward providing such a solution.

It is an object of the present invention to provide a solution for the autonomous and optional operator directed switching (both remotely and within the device) of electrical loads for marine vessels and motor vehicles where one or more battery systems are utilized, more than one separate electrical load group is utilized, circuit protection is embedded within the switching function, local manual switching is included within the solution, or cross-component communications is included within the solution.

These and other objects of the present invention will be apparent to those skilled in the art from the description that follows.

SUMMARY OF THE INVENTION

The present invention is a device providing a flexible electrical system distribution, switching, and protection solution by offering two or more autonomous electrical switching devices and optionally adding circuit protection and manual switching in one self-contained device The present invention consists a printed circuit board assembly configured to operate two or more electrical switch functions to act from a remote signal input or autonomously, independently or simultaneously. The printed circuit board can be assembled into a housing where multiple independent circuits on the printed circuit board assembly can be permanently electrically connected to each other through electrical conductors thus reducing the number of independent circuits within the assembly. The assembly further consists of an electrically isolative housing and terminal studs and retaining nuts capable to receiving electrical cable ring terminals.

The device taught by the present invention provides uniquely separate and autonomous functionality within one electrical switching device for the purposes of combining those functions into one unit.

The advantages of the present invention are that a singular high precision complex electron-mechanical device can be constructed and leveraged to solve a wide multitude of application requirements. This allows significantly improved cost efficiencies which can result in improved value to those who purchase the device taught by the present invention. An additional significant advantage is the ability to combine more than one switching device within a purpose built enclosure able to sense battery voltage and make automatic decisions with respect to the open/close state of the switches leverages the cost of microprocessor electronics across more than one switching device.

BRIEF DESCRIPTION OF THE DRAWINGS

The accompanying drawings, which are incorporated herein form a part of the specification, illustrate the present invention and, together with the description, further explain the principles of the present invention and to enable a person skilled in the pertinent art to make and use the present invention.

FIG. 9 depicts an alternative external connection architecture of embodiment where the positive terminal of a battery is connected to the power input terminal and the negative terminal of battery is connected the negative collection terminal.

FIG. 10 depicts an additional alternative external connection architecture of an embodiment where the positive terminal of a battery is connected to the power input terminal.

DETAILED DESCRIPTION OF THE PRESENT INVENTION

Figure 1:
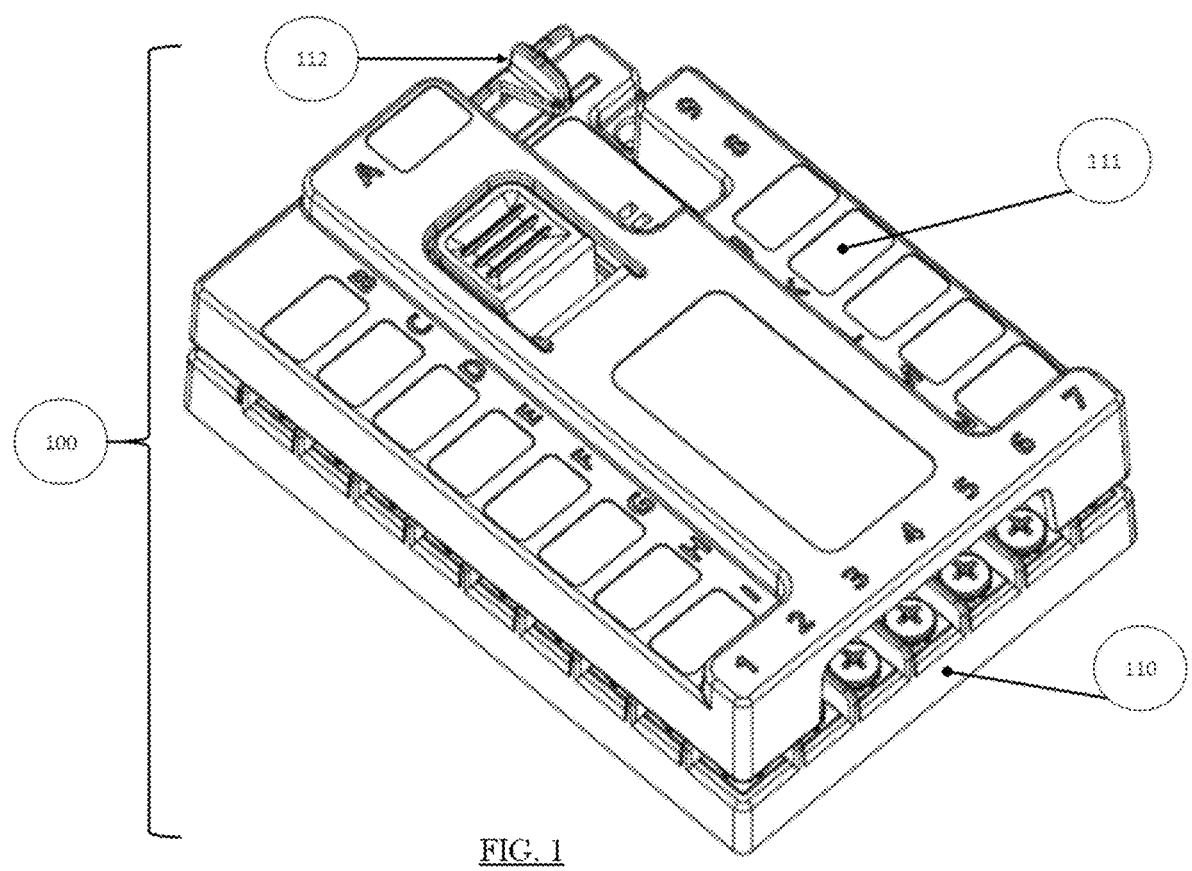
FIG. 1 depicts the overall invention in its most complex physical configuration from a top isometric perspective.

In the following detailed description of the present invention of exemplary embodiments of the present invention, reference is made to the accompanying drawings (where like numbers represent like elements), which form a part hereof, and in which is shown by way of illustration specific exemplary embodiments in which the present invention are practiced. These embodiments are described in sufficient detail to enable those skilled in the art to practice the present invention, but other embodiments are utilized and logical, mechanical, electrical, and other changes are made without departing from the scope of the present invention. The following detailed description is, therefore, not to be taken in a limiting sense, and the scope of the present invention is defined only by the appended claims.

In the following description, numerous specific details are set forth to provide a thorough understanding of the present invention. However, it is understood that the present invention are practiced without these specific details. In other instances, well-known structures and techniques known to one of ordinary skill in the art have not been shown in detail in order not to obscure the present invention.

The present invention is a device that can provide a flexible electrical system distribution, switching, and protection solution. Additionally, the purpose of the present invention is to provide a device with a single microprocessor and multiple on-board sensors capable of autonomously switching on-board electrical switches based on internal sensor feedback and/or external user driven control inputs.

By offering two or more autonomous electrical switching devices and optionally adding circuit protection and manual switching in one self-contained device, the present invention reduces total installed space, cost, and installation time for many typical system architectures that require each function and would otherwise be solved through separate devices. Through a solution that incorporates the same internal printed circuit board assembly for a multitude of potential application configurations, the device taught by the present invention offers its manufacturer significant improvements in cost efficiency due to the ability to leverage higher volumes of fewer components. This allows the devices manufacturer to pass those cost efficiencies along to its customers and in turn achieve more cost efficiencies through increased sales of a more competitive overall solution.

The present invention consists of several unique sections. First, a printed circuit board assembly configured to operate two or more electrical switch functions to act from a remote signal input or autonomously, independently or simultaneously; and for the printed circuit board assembly to be optionally able to be assembled into a housing where multiple independent circuits on the printed circuit board assembly can be permanently electrically connected to each other through electrical conductors thus reducing the number of independent circuits within the assembly. The assembly further consists of an electrically isolative housing and terminal studs and retaining nuts capable to receiving electrical cable ring terminals.

Second, the present invention teaches a device that provides uniquely separate and autonomous functionality within one electrical switching device for the purposes of combining those functions into one unit.

One embodiment of the device taught by the present invention is to provide (a) automatic battery charge sharing/isolation between two batteries/charge sources while also providing (b) voltage or ignition sense electrical switching of electrical loads.

A second embodiment of the device taught by the present invention is to provide (a) automatic battery charge sharing/isolation between a first battery/charge source and a second battery/charge source while also providing (b) automatic battery charge sharing/isolation between a third battery/charge source and the second battery/charge source.

A third embodiment of the device taught by the present invention is to provide (a) voltage or ignition sense electrical switching of one isolated electrical load group from a battery or charge source. while also providing (b) voltage or ignition sense electrical switching of a second isolated electrical load group from a the same or different battery or charge source.

A fourth embodiment of the device taught by the present invention is to provide (a) voltage or ignition sense electrical switching of an isolated electrical load group from a first battery or charge source. while also providing (b) voltage or ignition sense electrical switching of the same isolated electrical load group from a second battery or charge source.

The advantages of the present invention are that (1) a singular high precision complex electron-mechanical device can be constructed and leveraged to solve a wide multitude of application requirements. This allows significantly improved cost efficiencies which can result in improved value to those who purchase the device taught by the present invention. An additional significant advantage is that (2) the ability to combine more than one switching device within a purpose built enclosure able to sense battery voltage and make automatic decisions with respect to the open/close state of the switches leverages the cost of microprocessor electronics across more than one switching device. Additional benefits are achieved by eliminating technician and field wiring connections between multiple devices and replacing those connections with factory-controlled connections within the subject invention.

Referring to the figures, it is possible to see the various major elements constituting the apparatus of the present invention.

FIG. 1 depicts the overall invention 100 in its most complex physical configuration from a top isometric perspective. The housing 110 encompasses the electronics assembly not shown in this figure. A top cover 111 sits on top of the housing 100 to protect exposed electrical terminals under the cover. A manual on/off slide switch 112 is accessible with the cover 111 assembled to the housing 110.

Figure 2:
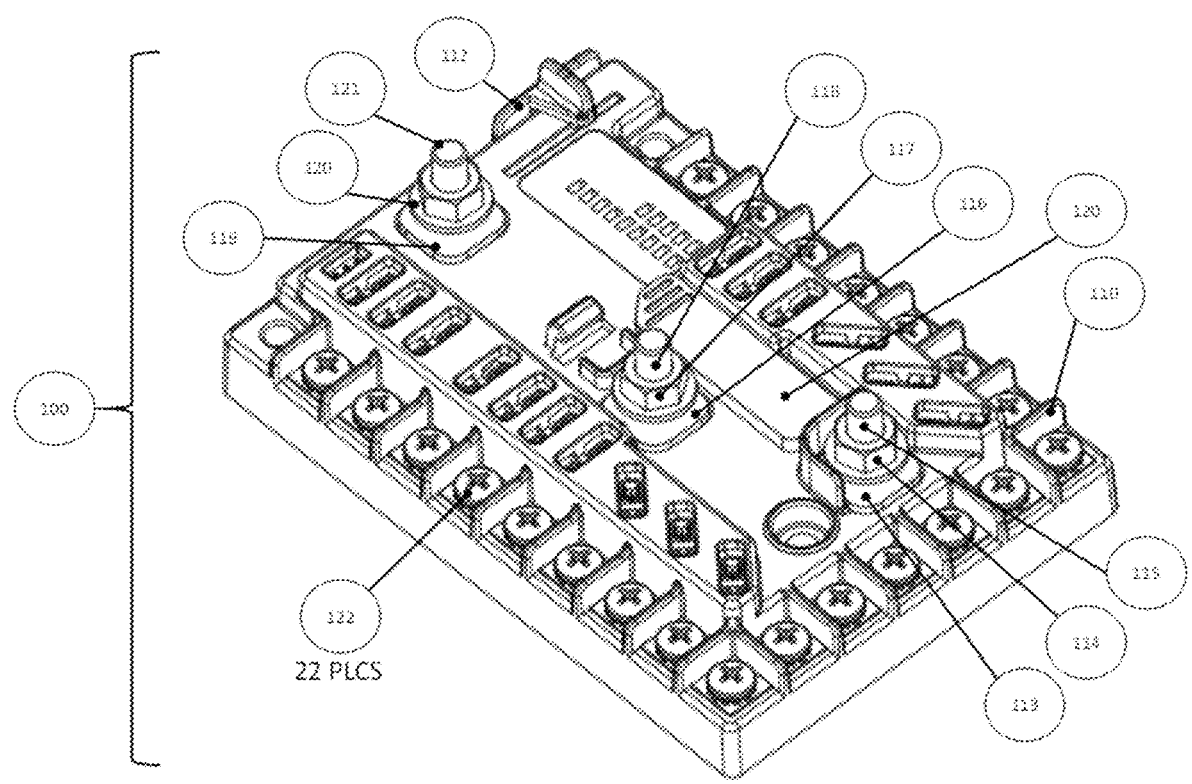
FIG. 2 depicts the present invention with the top cover removed.

FIG. 2 depicts the present invention 100 with the top cover removed. The housing 110 has a programming cover 120 for users to access and change device operational settings via a dip switch under the cover. Positive battery electrical power is provided via an input terminal base 116 and power input terminal screw 118 are situated to receive an electrical power cable ring terminal which is secured with flange nut 117. Negative/Ground battery electrical connection is provided via a terminal base 113 and power input terminal screw 115 are situated to receive an electrical power cable ring terminal which is secured with flange nut 114. Ring terminal screws 122 are located on three sides of the housing 110 for control signal input and fuse/circuit breaker protected power distribution from the device. Unfused switched power is provided via an output terminal base 119 and power input terminal screw 121 are situated to receive an electrical power cable ring terminal which is secured with flange nut 120.

Figure 3:
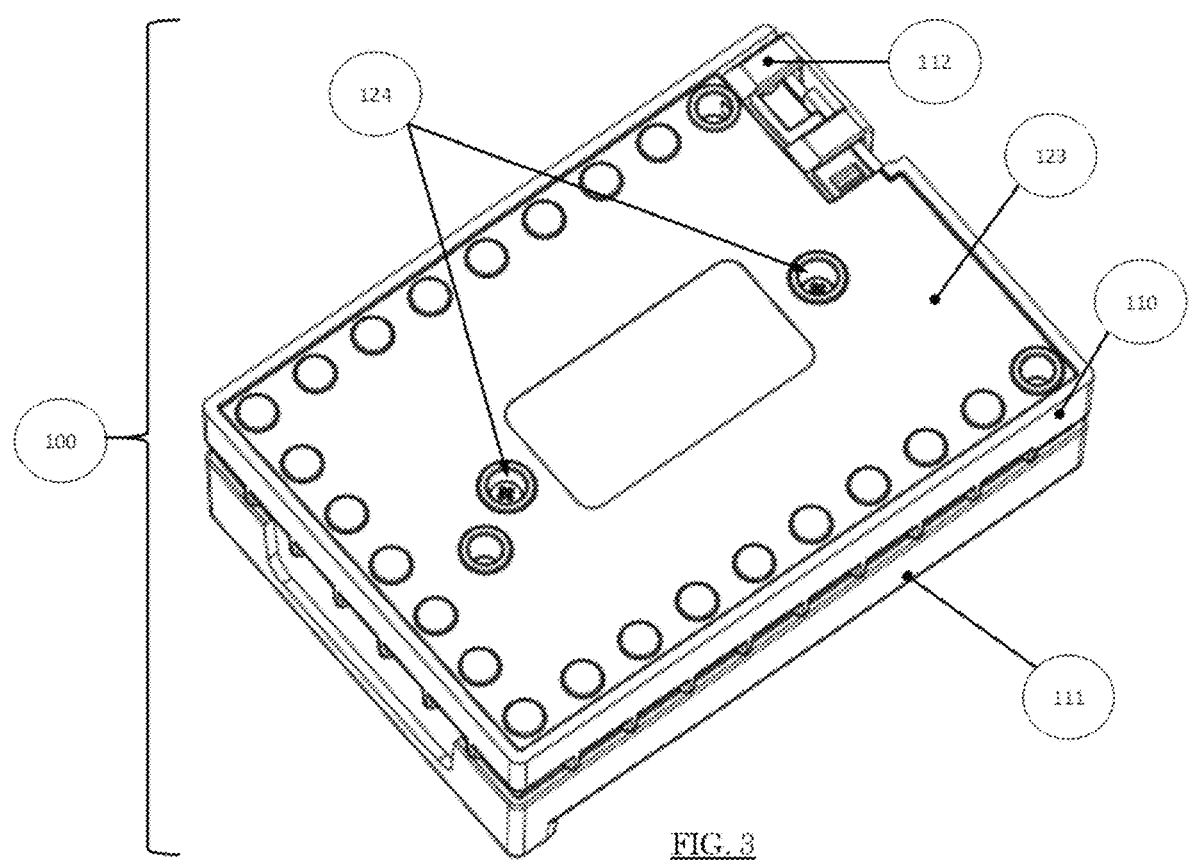
FIG. 3 depicts the present invention from the bottom isometric perspective with a bottom cover containing the internal components with two (2) screws securing the bottom cover to the housing.

FIG. 3 depicts the present invention 100 from the bottom isometric perspective with a bottom cover 121 containing the internal components with two (2) screws 124 securing the bottom cover to the housing 110.

Figure 4:
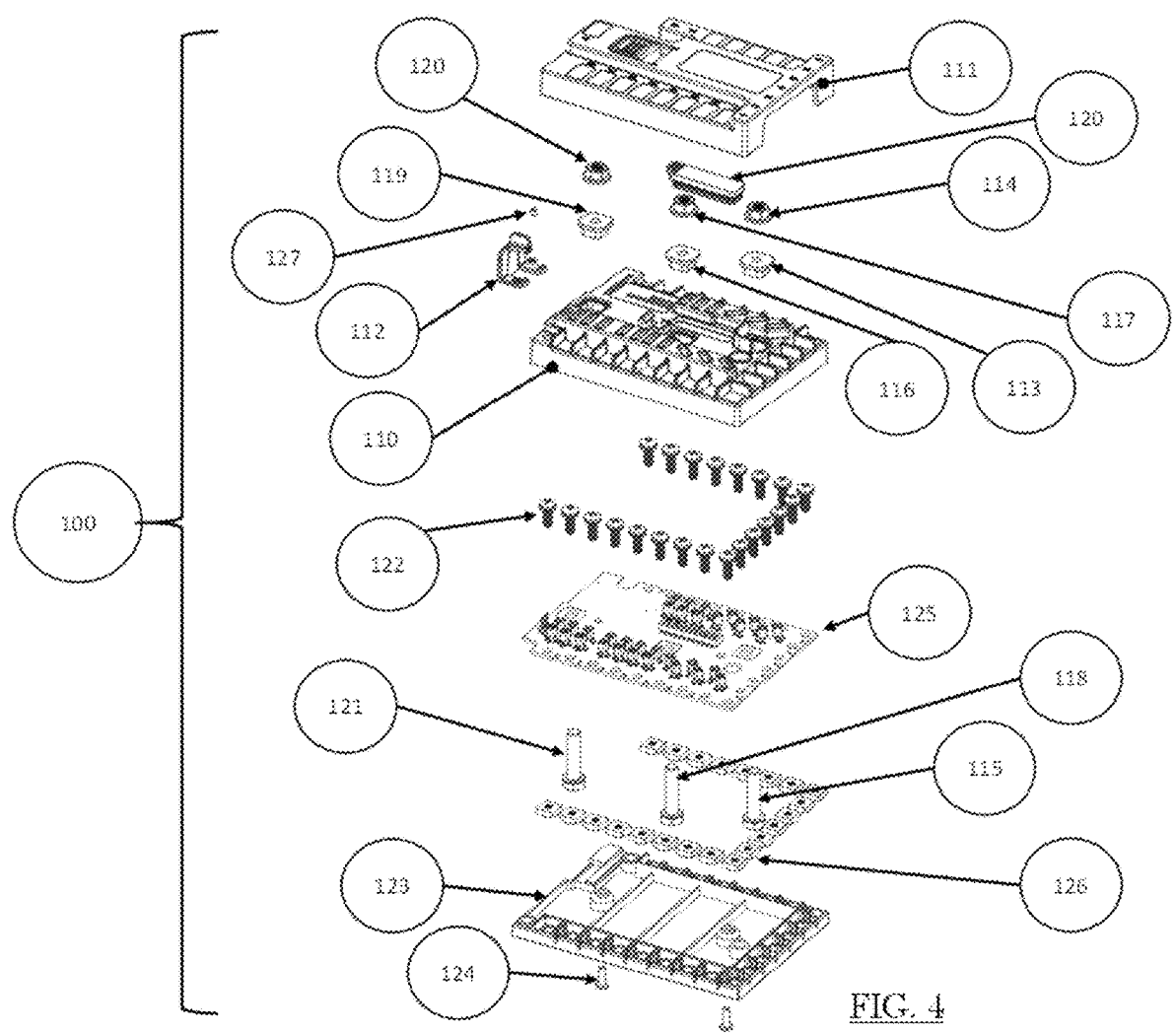
FIG. 4 depicts the present invention in an exploded view state with all major components and sub-assemblies depicted.

FIG. 4 depicts the present invention 100 in an exploded view state with all major components and sub-assemblies depicted. The bottom cover screws 124 secure the bottom cover 123 to the housing 110 after passing through the circuit board assembly 125. The terminal studs 115, 118, and 121 pass through the circuit board assembly 125 which fits within the housing 110. The terminal studs 115, 118, and 121 further thread into terminal housing nuts 113, 116, and 119 respectively to fully secure the circuit board assembly 125 inside the housing 110 and ensure effective electrical contact between customer connected electrical cable ring terminals and the circuit board assembly 125 through the terminal housing nuts 113, 116, and 119. Flange nuts 114, 117, and 120 are used to secure the attachment of electrical cable terminals. The programming cover 120 assembles to the housing 110 from the top side of the housing 110. Low amperage input/output ring terminal screws 122 assembled through the top of the circuit board assembly 125 and assemble into square retaining nuts 126 on the bottom side of the circuit board assembly 125. The manual override slide switch 112 assembles to the present invention 100 from the side of the assembly and contains a magnet 127 contained within the slide switch 112.

Figure 5:
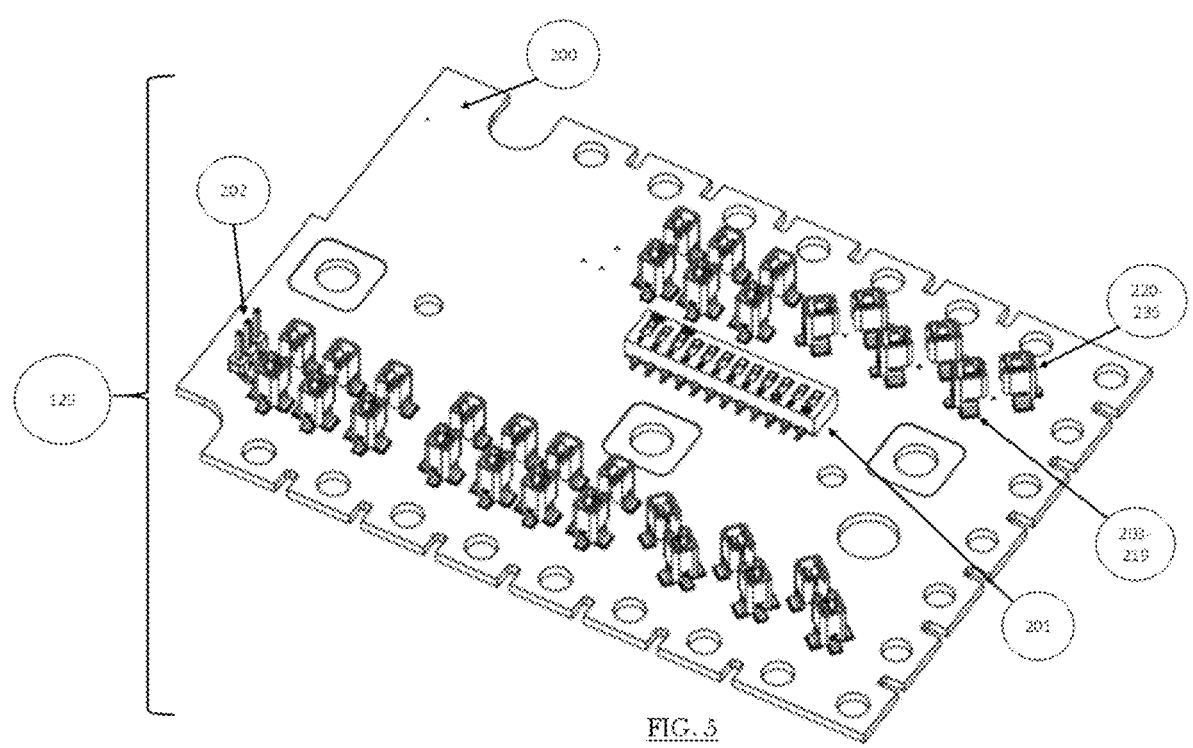
FIG. 5 depicts the circuit board assembly, which consists of a printed circuit board, dip switch array for setting features, programming header, fuse input terminals and fuse output terminals.

FIG. 5 depicts the circuit board assembly 125, which consists of a printed circuit board 200, dip switch array 201 for setting features, programming header 202, fuse input terminals 203-219 and fuse output terminals 230-235. Further circuit board elements are not shown but include a microprocessor control unit (MCU) that serves to interpret external control signals and internal sensor signals, electronic or electromechanical switching elements, light emitting diodes for indicating state of outputs and device in general, and other necessary supporting electronics components.

Figure 6:
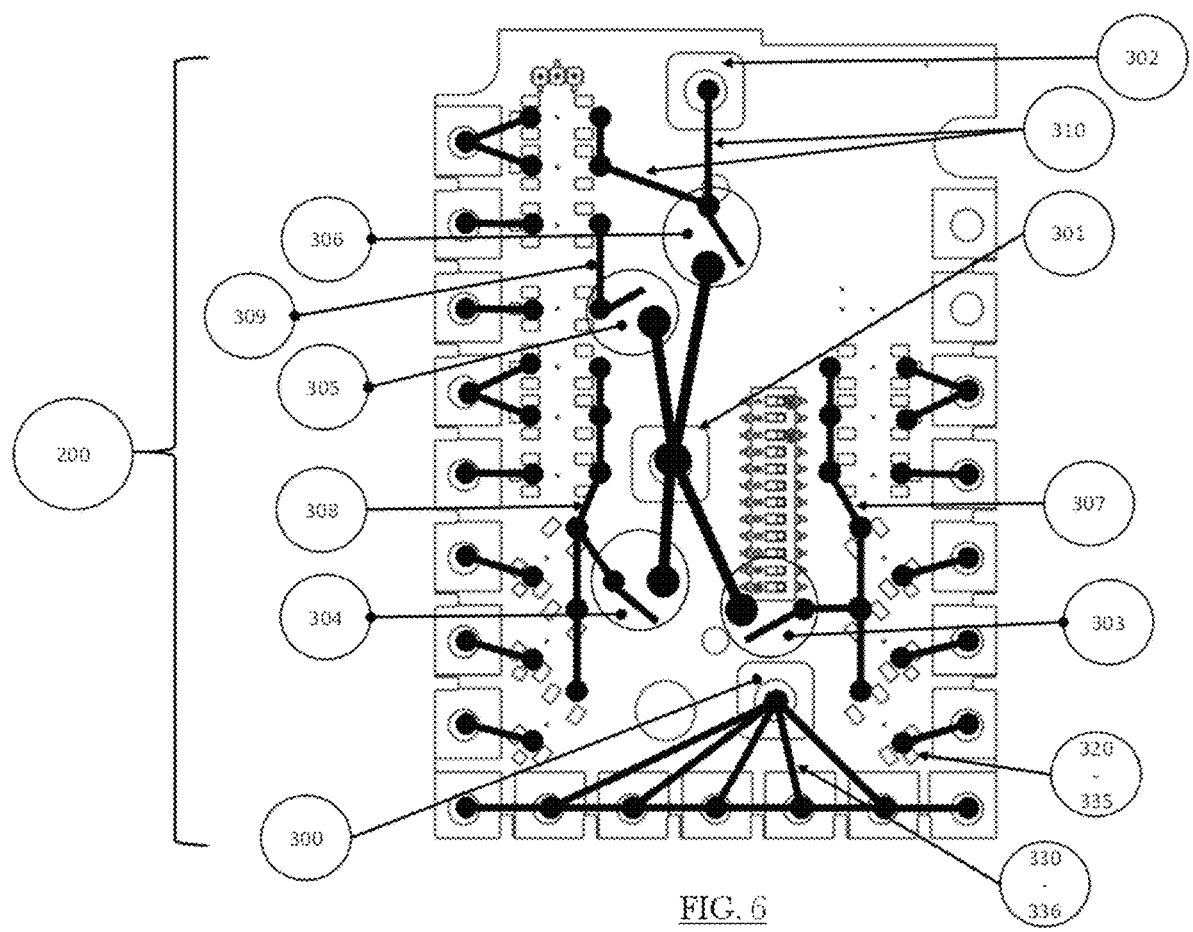
FIG. 6 further depicts the top side of the circuit board assembly from FIG. 6 with primary internal electrical power planes also depicted, where terminal receiving pads are sized and located to allow the terminal studs from FIG. 4 to pass through the printed circuit board.

FIG. 6 further depicts the top side of the circuit board assembly 125 from FIG. 6 with primary internal electrical power planes also depicted, where terminal receiving pads 300, 301, and 302 are sized and located to allow the terminal studs 115, 118, and 121 from FIG. 4 to pass through the printed circuit board 200.

FIG. 6 further depicts the power electrical connections of circuit board assembly 125, where electrical power from electrical contact pad 301 is directly connected to one side of the electrical switches 303, 304, 305, & 306. Electrical power from electrical contact pad 300 is directly connected to electrical traces 330-336 for ground return purposes. The output of electrical switch 303 is directly connected to five fuse input terminals previously shown in FIG. 5 via the internal copper plane 307. The output of electrical switch 304 is directly connected to five fuse input terminals previously shown in FIG. 5 via the internal copper plane 308. The output of electrical switch 305 is directly connected to two fuse input terminals previously shown in FIG. 5 via the internal copper plane 309. The output of electrical switch 306 is directly connected to one fuse input terminal previously shown in FIG. 5 and the unfused electrical contact pad 302 via the internal copper plane 310. Fuse output terminals 320-335 are electrically connected to the adjacent terminal pads.

Figure 7:
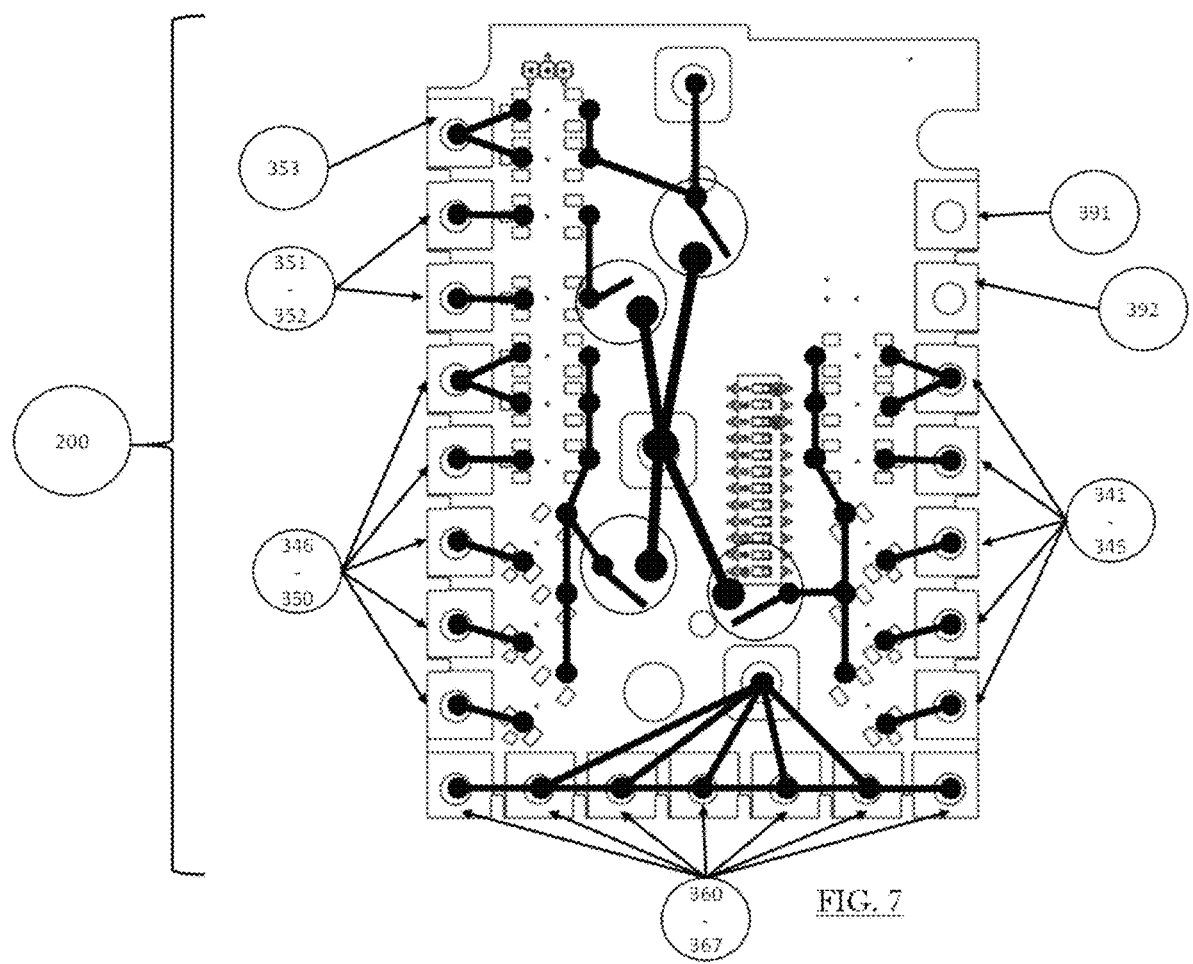
FIG. 7 continues the description of the electrical circuit board internal construction where electrical copper planes outlined in FIG. 6 are further shown connected in FIG. 7 to ring terminal pads.

FIG. 7 continues the description of the electrical circuit board 200 internal construction where electrical copper planes 320-335 outlined in FIG. 6 are further shown connected in FIG. 7 to ring terminal pads 341-345, 346-351, 351-351, and 353. Importantly, several ring terminal pads are shown connected to two fuse output terminals. This feature allows the connection of a wider range of wires to the output terminal pads that are connected to two fuse output terminals, as the installation of one or two fuses are both optional for those output terminal pads. Control input/output terminal pads 391 and 392 are utilized to provide logic signal control inputs and low amperage output signals.

Figure 8:
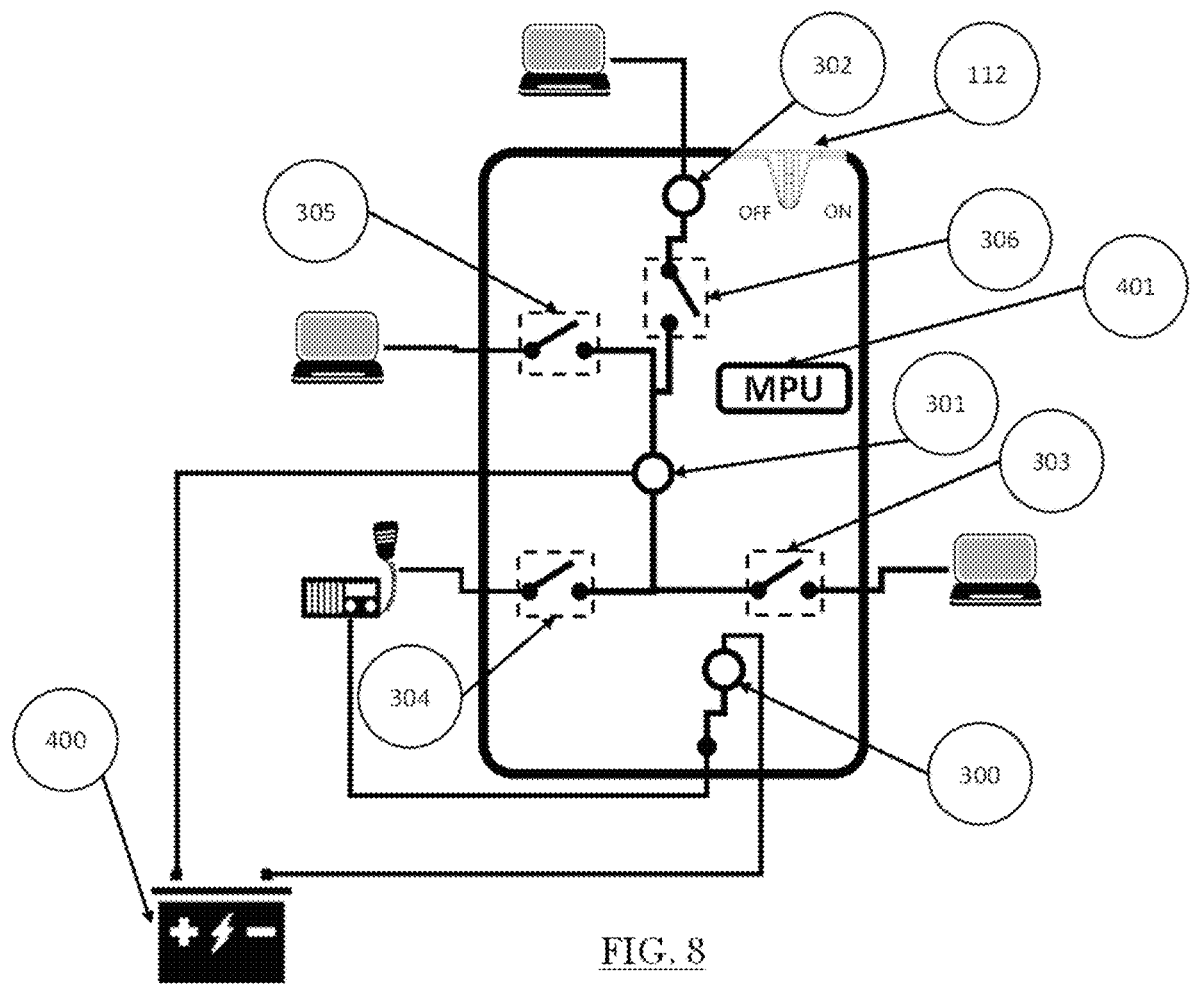
FIGS. 8 through 10 depict several system level implementations of one embodiment of the present invention.

Focusing towards the right side of FIG. 8, electrical trace 402 connects the other side of switch 203A to electrical contact pad 302. A separate contact trace 403 connects the other side of switch 203B to electrical contact pad 303. Before assembly into the housing 110 with any additional components, the electrical contact pads 301 and 302 remain electrically isolated from each other.

Figure 9:
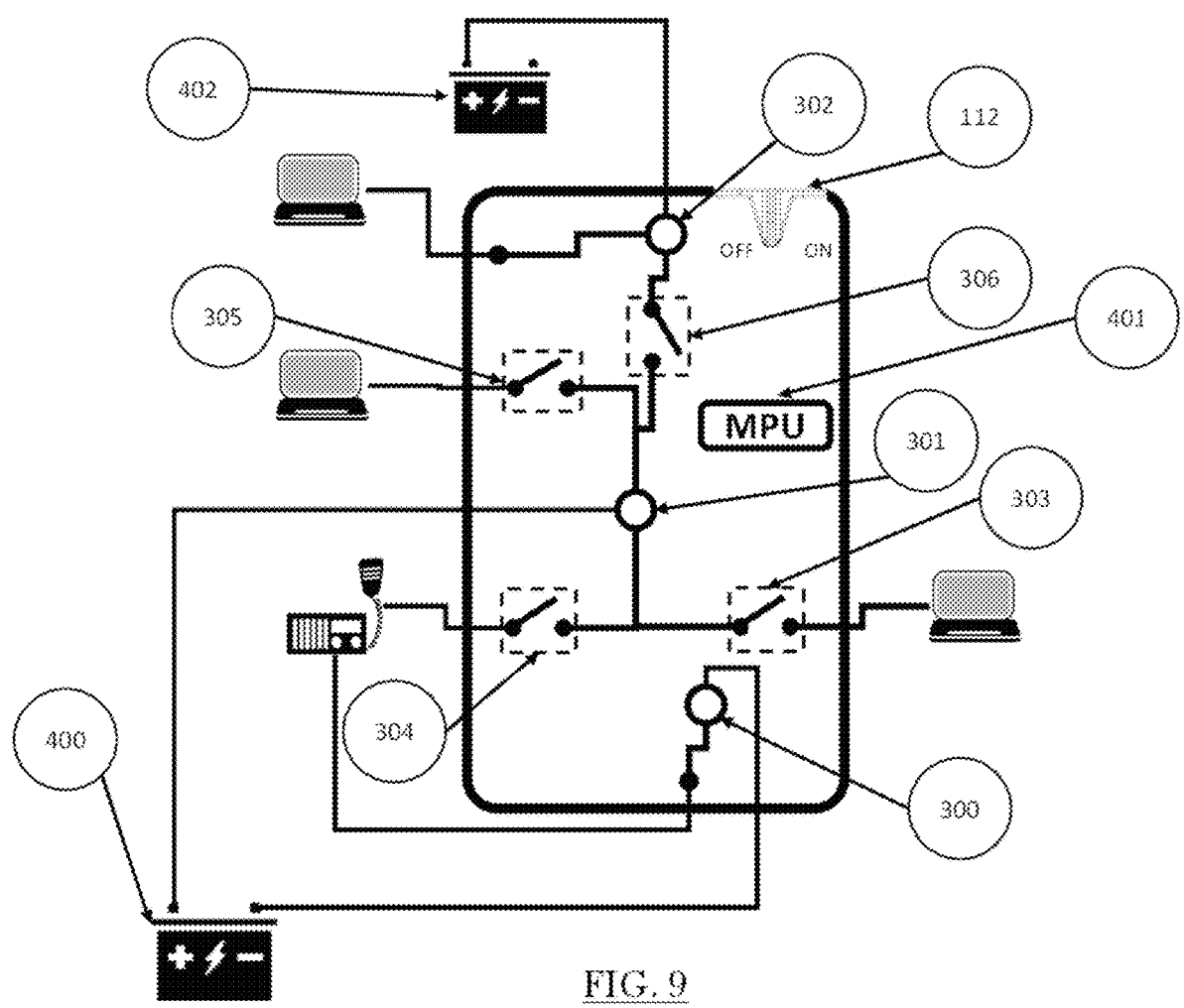
Figure 10:
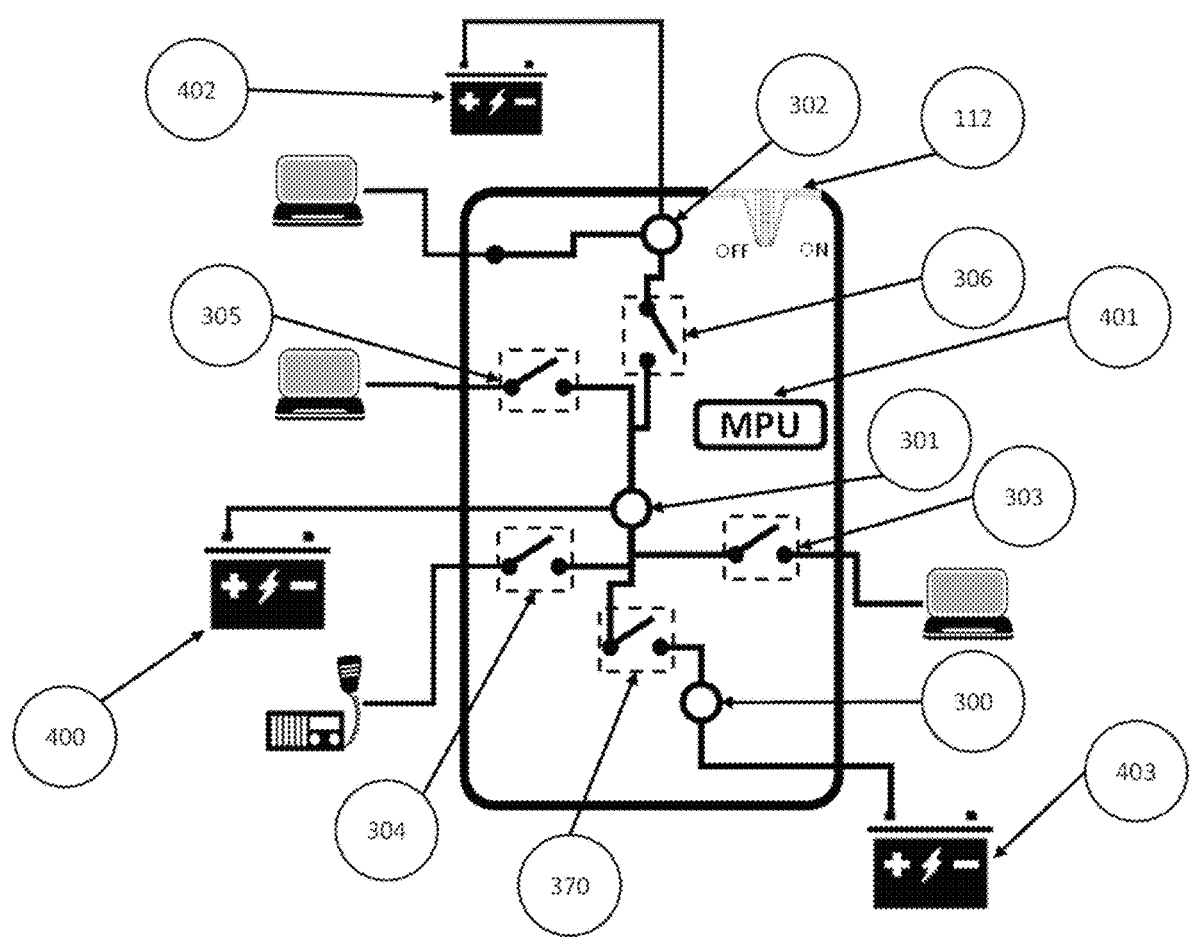

FIGS. 8 through 10 depict several system level implementations of embodiment 100. FIG. 8 depicts embodiment 100 as described in FIGS. 6 and 7 where the positive terminal of a battery 400 is connected to the power input terminal 301 and the negative terminal of battery 400 is connected the negative collection terminal 300. Functional elements 303, 304, 305, and 306 can operate as user controllable on/off switches or they can be automatically turned on and off depending on the state of charge for the auxiliary battery 400. An optionally assembled manual control switch 112 can be configured to control one or more of the internal electrical switching elements 303, 304, 305, and 306. Automatic functionality if desired is achieved through a microprocessor control unit (MCU) 401 located on the printed circuit board assembly 125 within the embodiment 100.

FIG. 9 depicts an alternative external connection architecture of embodiment 100 where the positive terminal of a battery 400 is connected to the power input terminal 301 and the negative terminal of battery 400 is connected the negative collection terminal 300. The positive terminal of a second battery 402 is connected to the power input terminal 302. Functional elements 303, 304, 305, and 306 can operate as user controllable on/off switches or they can be automatically turned on and off depending on the state of charge for battery 400 and/or battery 402. An optionally assembled manual control switch 112 can be configured to control one or more of the internal electrical switching elements 303, 304, 305, and 306. Automatic functionality if desired is achieved through a microprocessor control unit (MCU) 401 located on the printed circuit board assembly 125 within the embodiment 100

FIG. 10 depicts an additional alternative external connection architecture of embodiment 100 where the positive terminal of a battery 400 is connected to the power input terminal 301. The positive terminal of a second battery 402 is connected to the power input terminal 302. The positive terminal of a third battery 403 is connected to the power input terminal 300. Functional elements 303, 304, 305, 306, and 370 can operate as user controllable on/off switches or they can be automatically turned on and off depending on the state of charge for battery 400 and/or battery 402 and/or battery 403. An optionally assembled manual control switch 112 can be configured to control one or more of the internal electrical switching elements 303, 304, 305, 306, and 370. Automatic functionality if desired is achieved through a microprocessor control unit (MCU) 401 located on the printed circuit board assembly 125 within the embodiment 100

Figure 11:
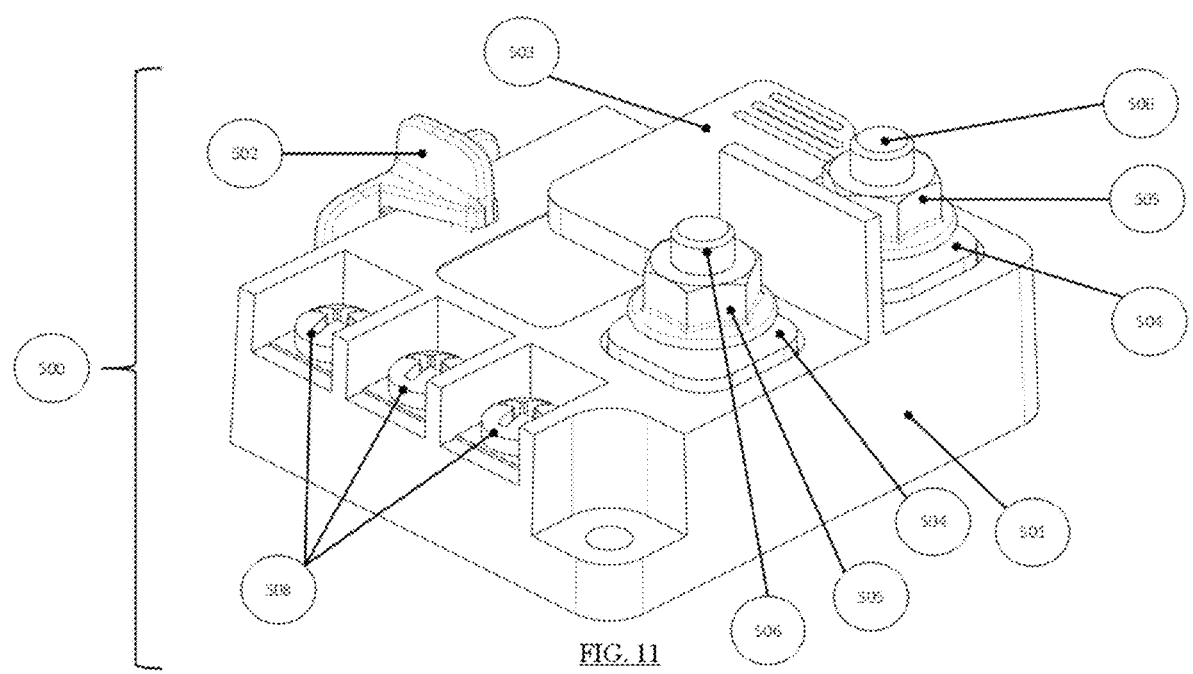
FIG. 11 depicts an alternate embodiment of the present invention without an integrated circuit protection functionality where the enclosure is fully sealed.

FIG. 11 depicts an alternate embodiment of the present invention 500 without integrated circuit protection functionality where the enclosure is fully sealed. Power connection terminal nuts 504 pass through enclosure base 501. Power terminal studs 506 thread into terminal nuts 504 and secure user installed power cable ring terminals (not shown) with locking nuts 505. Dip switch cover 503 seals the user accessible compartment for accessing dip switches within the enclosure. Control signal wire ring terminal attachment screws 508 are accessible from the top of the device.

Figure 12:
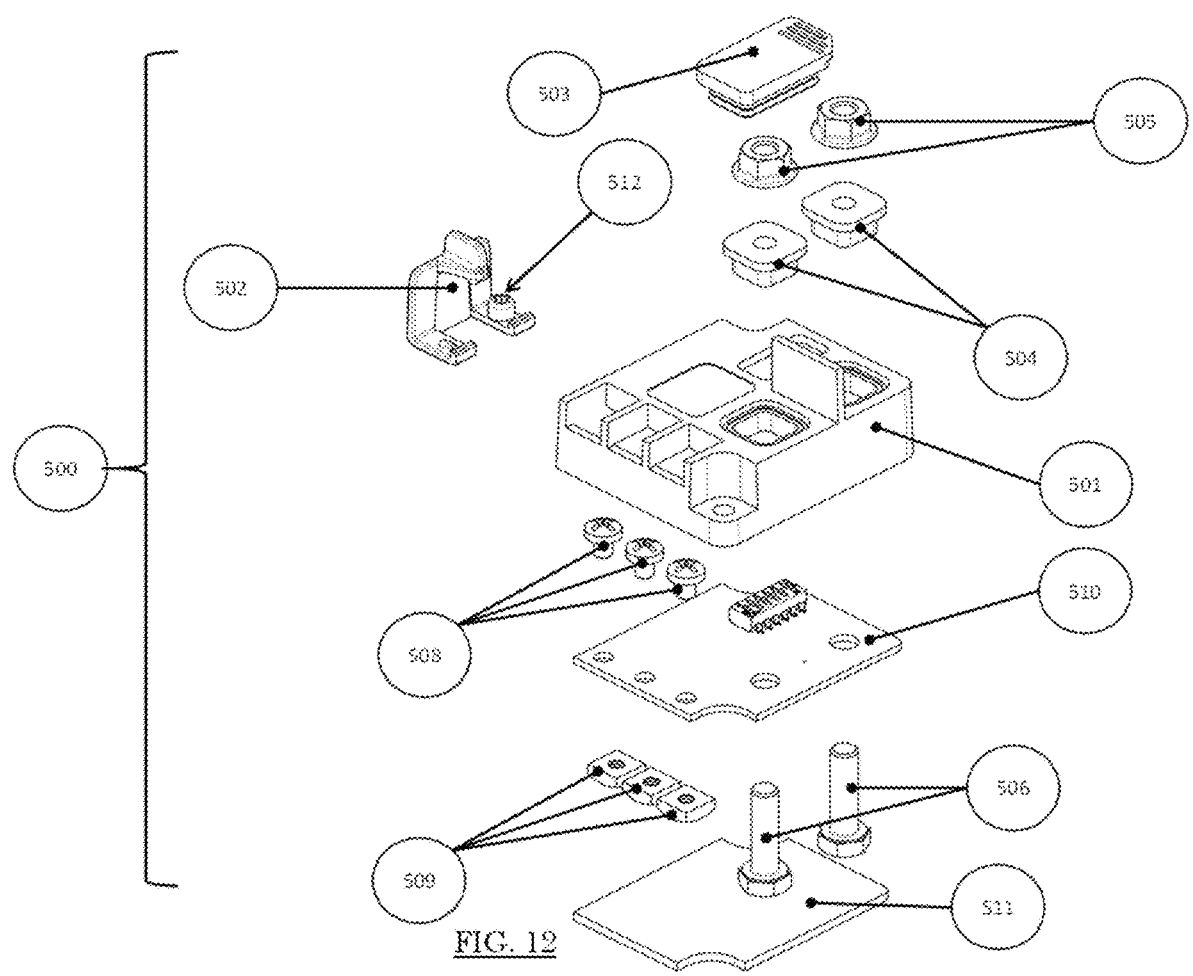
FIG. 12 depicts one embodiment of the present invention in an exploded view state with all major components and sub-assemblies depicted.

FIG. 12 depicts the embodiment 500 in an exploded view state with all major components and sub-assemblies depicted. The bottom cover 511 snaps into the housing 501. The terminal studs 506, pass through the circuit board assembly 510 which fits within the housing 501. The terminal studs 506 further thread into terminal housing nuts 504 to fully secure the circuit board assembly 501 inside the housing 501 and ensure effective electrical contact between customer connected electrical cable ring terminals and the circuit board assembly 501 through the terminal housing nuts 504. Flange nuts 505 are used to secure the attachment of electrical cable terminals. The programming cover 503 assembles to the housing 501 from the top side of the housing 501. Low amperage input/output ring terminal screws 508 assembled through the top of the circuit board assembly 510 and assemble into square retaining nuts 509 on the bottom side of the circuit board assembly 510. The manual override slide switch 502 assembles to the present invention 501 from the side of the assembly and contains a magnet 512 contained within the slide switch 502. Importantly, because the slide switch and magnet are assembled from the external of the device and transmit control signals magnetically through the bottom cover 511, the manual slide switch is able to manually control the device without a physical connection through the housing 501 or the bottom cover 511.

Figure 13:
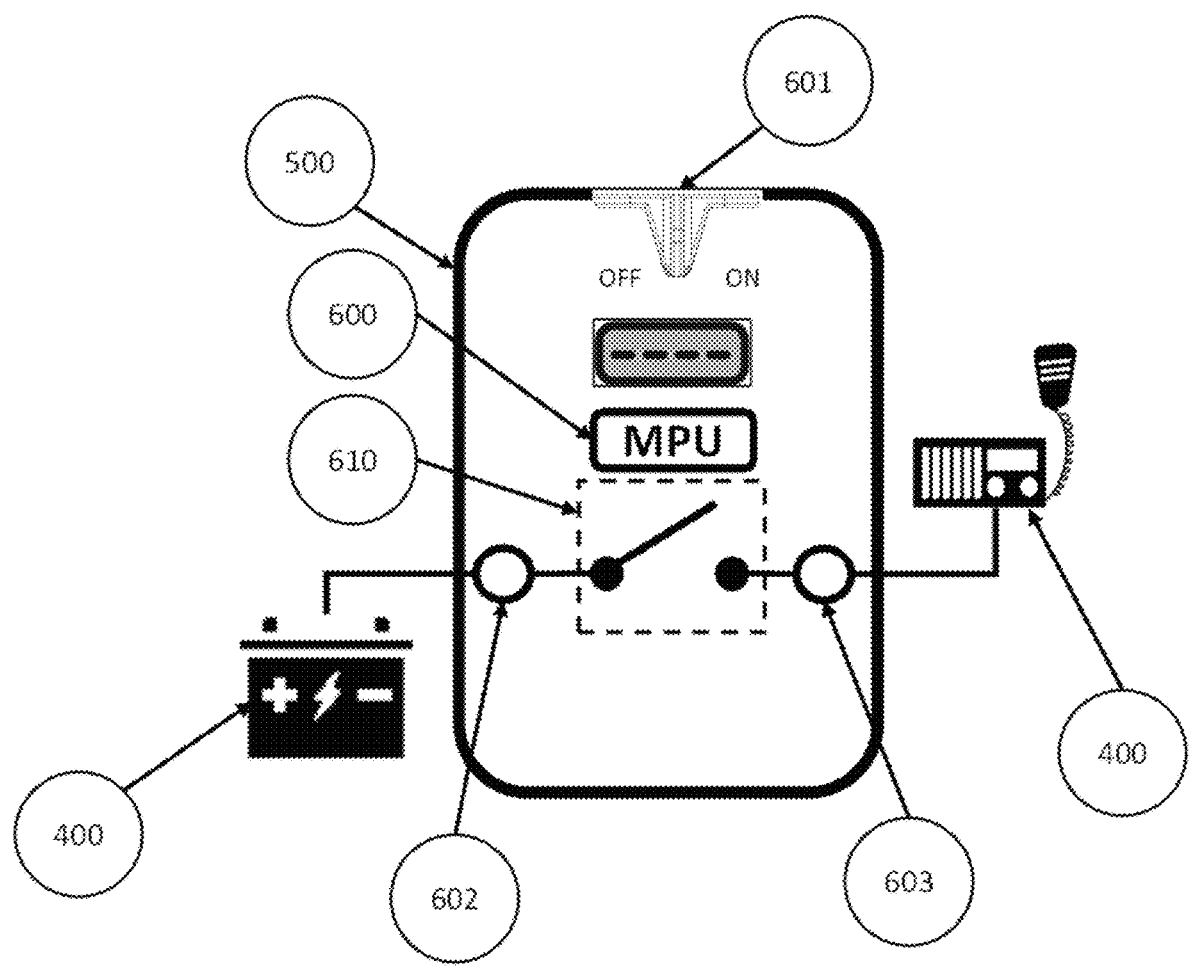
FIG. 13 depicts a system level implementations of the present invention.

FIGS. 13 through 16 depict several system level implementations of embodiment 500. FIG. 13 depicts embodiment 500 as described in FIGS. 11 and 12 where the positive terminal of a battery 400 is connected to the power input terminal 602. The positive power connection for load devices 410 are connected to the output terminal 603. Functional elements 610 can operate as a user controllable on/off switch or it can be automatically turned on and off depending on the state of charge of the auxiliary battery 400. An optionally assembled manual control switch 601 can be configured to control the internal electrical switching element 610. Automatic functionality if desired is achieved through a microprocessor control unit (MCU) 600 located on the printed circuit board assembly 510 within the embodiment 500

Figure 14:
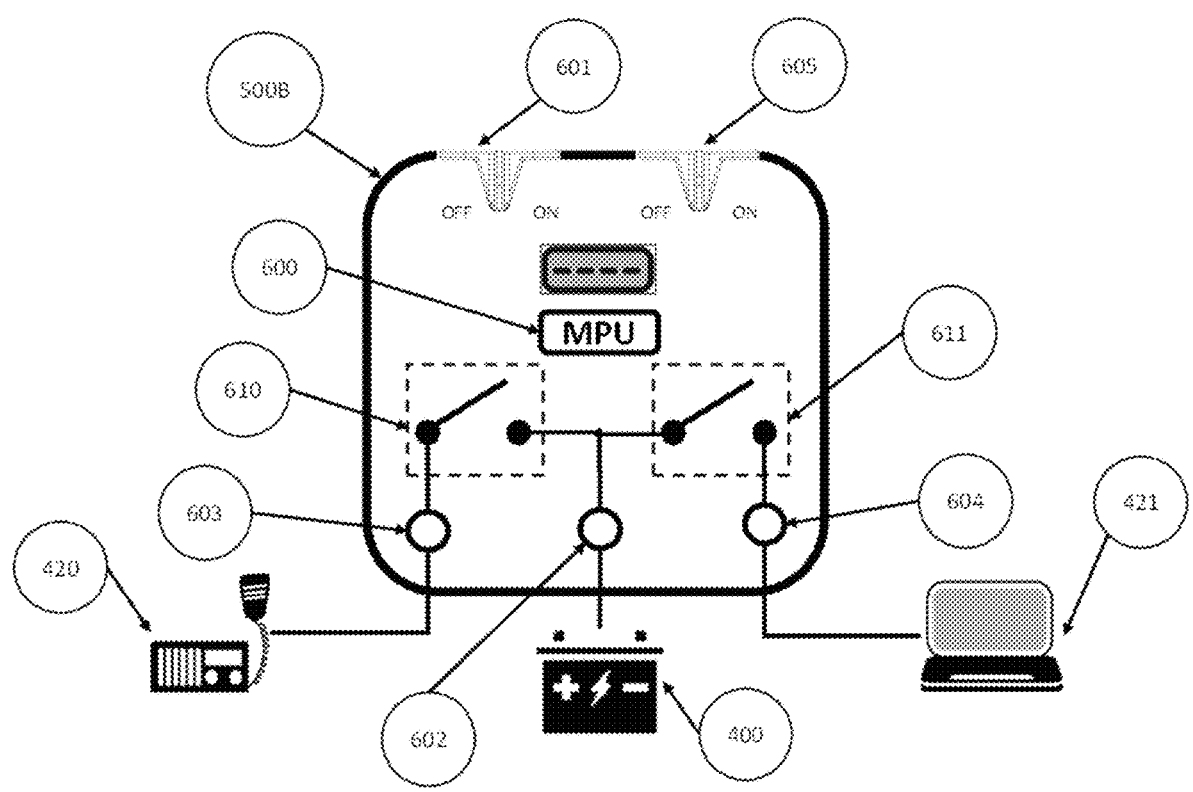
FIG. 14 depicts an alternate embodiment where additional power terminals and switching devices are added, as well as additional manual on/off switches.

FIG. 14 depicts an alternate embodiment 500B of the embodiment 500, where additional power terminals and switching devices are added, as well as additional manual on/off switches. The positive terminal of a battery 400 is connected to the power input terminal 602. A first output power terminal 603 is connected to a load device component 420, while a second output power terminal 604 is connected to a second load device component 421. Functional elements 610 and 611 can operate as user controllable remote on/off switches or they can be automatically turned on and off depending on the state of charge of the auxiliary battery 400. Optionally assembled manual control switches 601 and 605 can be configured to control one or more of the internal electrical switching elements 610 and 611. Automatic functionality if desired is achieved through a microprocessor control unit (MCU) 600 located on the printed circuit board assembly 510 within the embodiment 500B.

Figure 15:
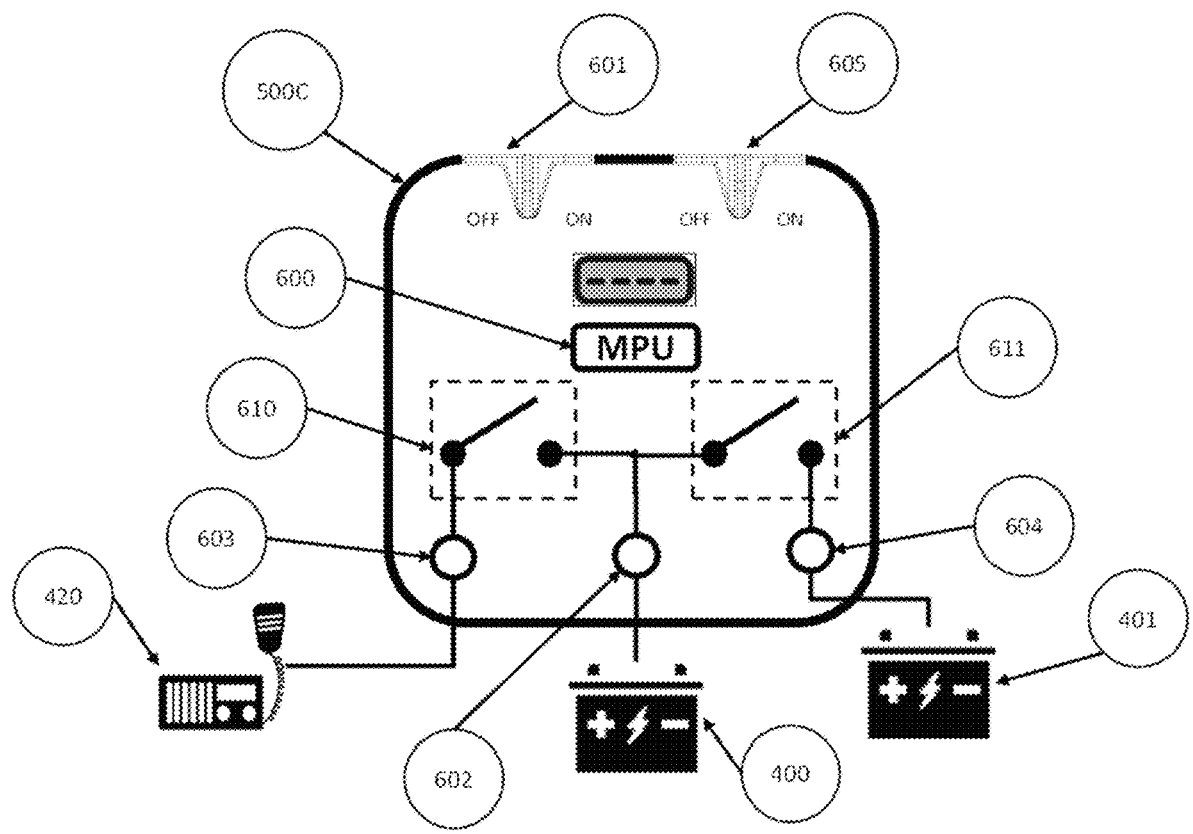
FIG. 15 depicts an alternate embodiment of the present invention.

FIG. 15 depicts an alternate embodiment 500C of the embodiment 500B. The positive terminal of a battery 400 is connected to the power input terminal 602. The positive terminal of a second battery 401 is connected to input terminal 604, while output power terminal 603 is connected to a load device component 420. Functional elements 610 and 611 can operate as user controllable remote on/off switches or they can be automatically turned on and off depending on the state of charge of the auxiliary battery 400 and/or the battery 401. Optionally assembled manual control switches 601 and 605 can be configured to control one or more of the internal electrical switching elements 610 and 611. Automatic functionality if desired is achieved through a microprocessor control unit (MCU) 600 located on the printed circuit board assembly 510 within the embodiment 500C.

Figure 16:
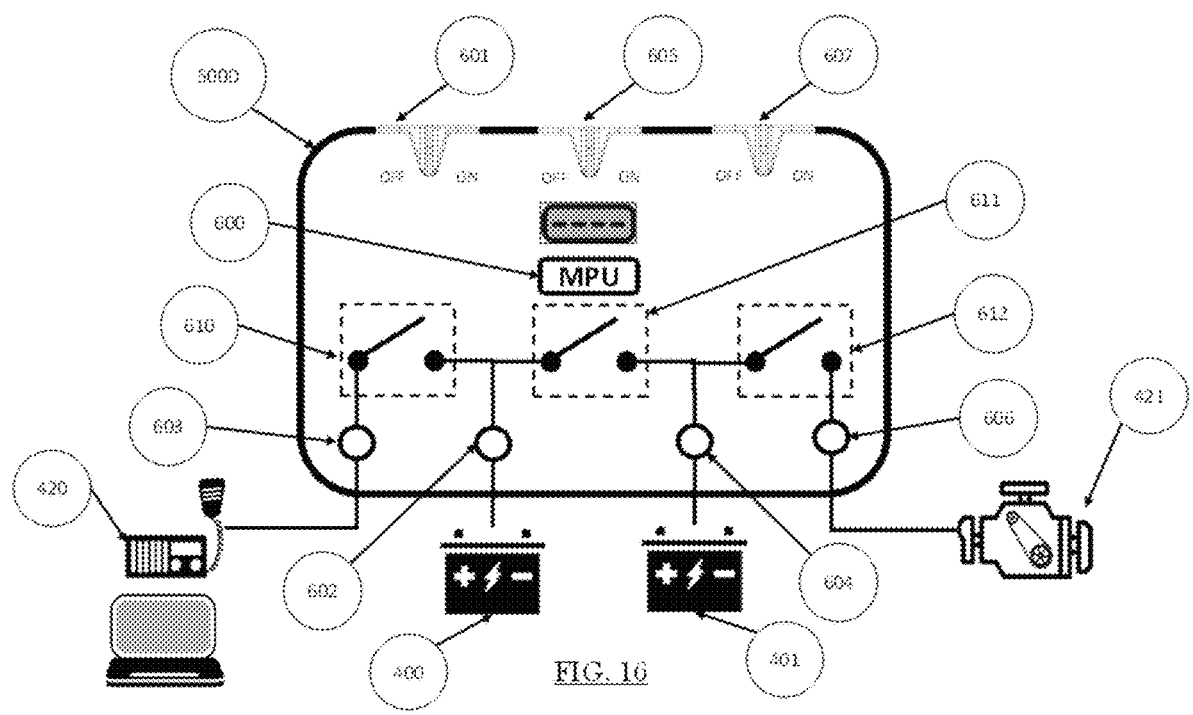
FIG. 16 depicts an alternate embodiment where additional power terminals and switching devices are added, as well as additional manual on/off switches.

FIG. 16 depicts an alternate embodiment 500D of the embodiment 500, where additional power terminals and switching devices are added, as well as additional manual on/off switches. The positive terminal of a battery 400 is connected to the power input terminal 602. The positive terminal of a second battery 401 is connected to input terminal 604. A first output power terminal 603 is connected to a load device component 420, while a second output power terminal 606 is connected to a second load device component 421. Functional elements 610, 611, and 612 can operate as user controllable remote on/off switches or they can be automatically turned on and off depending on the state of charge of the auxiliary battery 400 and/or the auxiliary battery 401. Optionally assembled manual control switches 601, 605, and 607 can be configured to control one or more of the internal electrical switching elements 610, 611, and 612. Automatic functionality if desired is achieved through a microprocessor control unit (MCU) 600 located on the printed circuit board assembly 510 within the embodiment 500D.

Figure 17:
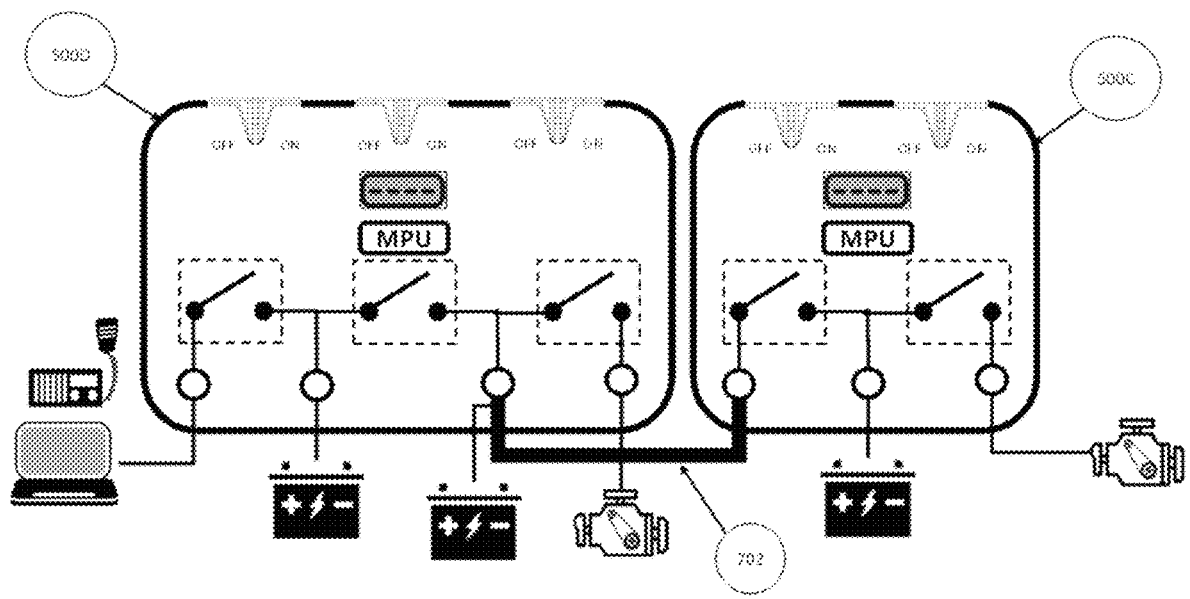
FIGS. 17-18 depict the embodiments within various system configurations as envisioned in practical use.
Figure 18:
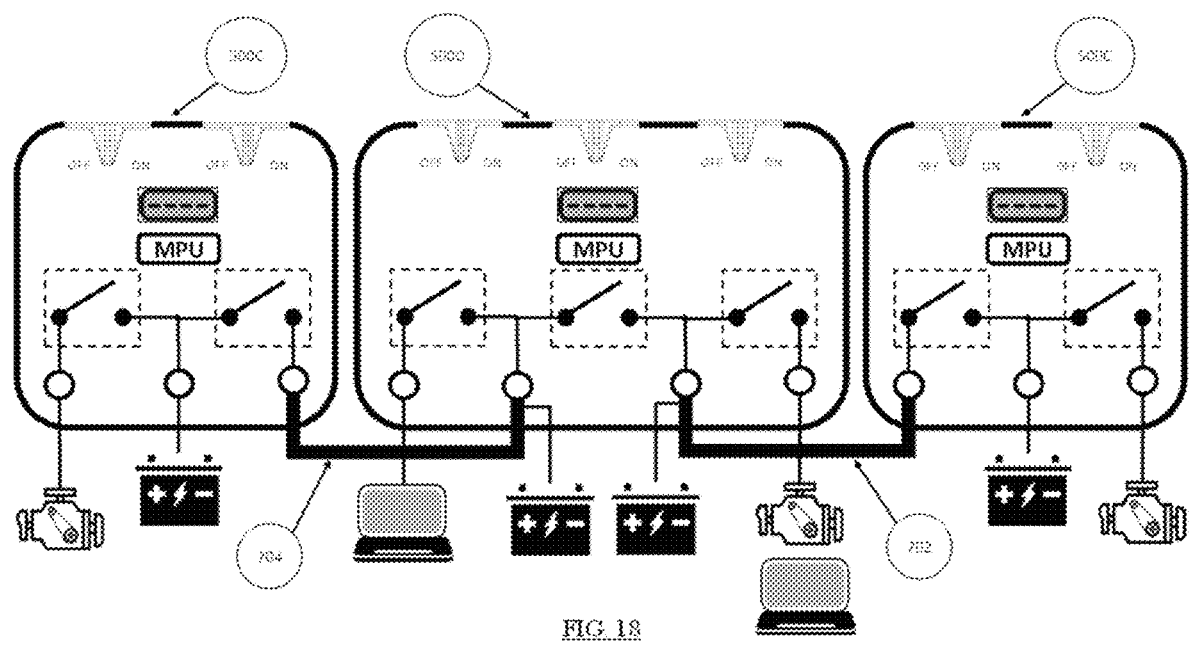

FIGS. 17-18 depict the embodiments 500C and 500D within various system configurations as envisioned in practical use. FIG. 17 shows embodiment 500D and embodiment 500C connected electrically with an electrical conductor 702, resulting in the system functionality of being able to interconnect three separate batteries and remotely disconnect the loads from three separate batteries. FIG. 18 shows embodiment 500D and qty 2 of embodiment 500C, all three embodiments connected electrically with electrical conductors 702 and 704, resulting in the system functionality of being able to interconnect four separate batteries and remotely disconnect the loads from four separate batteries.

With respect to any necessary software or computer programming, the system is set to run on a computing device or mobile electronic device. A computing device or mobile electronic device on which the present invention can run is comprised of a CPU, storage device, keyboard, monitor or screen, CPU main memory and a portion of main memory where the system resides and executes. Any general-purpose computer, smartphone, or other mobile electronic device with an appropriate amount of storage space is suitable for this purpose. Computer and mobile electronic devices like these are well known in the art and are not pertinent to the present invention. The system can also be written in several different languages and run on a number of different operating systems and platforms.

Although the present invention has been described in considerable detail with reference to certain preferred versions thereof, other versions are possible. Therefore, the point and scope of the appended claims should not be limited to the description of the preferred versions contained herein.

As to a further discussion of the manner of usage and operation of the present invention, the same should be apparent from the above description. Accordingly, no further discussion relating to the manner of usage and operation will be provided.

Therefore, the foregoing is considered as illustrative only of the principles of the present invention. Further, since numerous modifications and changes will readily occur to those skilled in the art, it is not desired to limit the present invention to the exact construction and operation shown and described, and accordingly, all suitable modifications and equivalents are resorted to, falling within the scope of the present invention.

The embodiments of the present invention in which an exclusive property or privilege is claimed are defined as follows:

1. A flexible electrical system distribution, switching, and protection device, comprising a housing; a printed circuit board (PCB); a top cover; a manual on/off slide switch is accessible with the top cover assembled to the housing; a programming cover to access and change device operational settings via a dip switch under the programming cover a positive battery electrical power is provided via an input terminal base and power input terminal screws are situated to receive an electrical power cable ring terminal which is secured with a flange nut; a Negative/Ground battery electrical connection is provided via a terminal base and power input terminal screw screws are situated to receive an electrical power cable ring terminal which is secured with the flange nut; ring terminal screws are located on three sides of the housing for control signal input and fuse/circuit breaker protected power distribution from the device; unfused switched power is provided via an output terminal base and power input terminal screw screws are situated to receive an electrical power cable ring terminal which is secured with the flange nut; a bottom cover containing internal components with screws securing the bottom cover to the housing; the bottom cover screws secure the bottom cover to the housing after passing through the circuit board assembly; one or more terminal studs pass through the circuit board assembly which fits within the housing; the one or more terminal studs further thread into terminal housing nuts respectively to fully secure the circuit board assembly inside the housing and ensure effective electrical contact between customer connected electrical cable ring terminals and the circuit board assembly through the terminal housing nuts; flange nuts secure the attachment of electrical cable terminals; the programming cover assembles to the housing from a top side of the housing, one or more low amperage input/output ring terminal screws are assembled through the top of the circuit board assembly and assemble into square retaining nuts on the a bottom side of the circuit board assembly; the manual override slide switch assembles to the housing from the side of the assembly and contains a magnet, contained within the slide switch, the printed circuit board assembly is configured to operate two or more electrical switch functions to act from a remote signal input or autonomously, independently or simultaneously; a single microprocessor on the PCB; and on or more on-board sensors capable of autonomously switching on-board electrical switches based on an internal sensor feedback and/or external user driven control inputs.

2. The device of claim 1, wherein
the printed circuit board is assembled into a housing where multiple independent circuits on the printed circuit board assembly can be permanently electrically connected to each other through electrical conductors; and
an electrically isolative housing and terminal studs and retaining nuts capable to receiving electrical cable ring terminals.

3. The device of claim 1, wherein
the circuit board assembly consists of
a printed circuit board,
dip switch array for setting features, programming header,
fuse input terminals and fuse output terminals;
a microprocessor control unit (MCU) that serves to interpret external control signals and internal sensor signals, electronic or electromechanical switching elements, light emitting diodes for indicating state of outputs and device in general, and other necessary supporting electronics components.

4. The device of claim 1, wherein
the circuit board assembly is further comprised of primary internal electrical power planes where terminal receiving pads are sized and located to allow the terminal studs to pass through the printed circuit board.

5. The device of claim 4, wherein
the power electrical connections of circuit board assembly, where electrical power from electrical contact pad is directly connected to one side of the electrical switches;
electrical power from electrical contact pad is directly connected to electrical traces for ground return purposes;
the output of electrical switch is directly connected to five fuse input terminals via the internal copper plane;
the output of electrical switch is directly connected to five fuse input terminals via the internal copper plane;
the output of electrical switch is directly connected to two fuse input terminals via the internal copper plane;
the output of electrical switch is directly connected to one fuse input terminal and the unfused electrical contact pad via the internal copper plane fuse output terminals are electrically connected to the adjacent terminal pads; and electrical copper planes are connected to ring terminal pads.

6. The device of claim 5, wherein one or more of the ring terminal pads are connected to two fuse output terminals allowing the connection of a wider range of wires to the output terminal pads that are connected to two fuse output terminals; and control input/output terminal pads are utilized to provide logic signal control inputs and low amperage output signals.

7. The device of claim 6, wherein the electrical circuit board is further comprised of an electrical trace connects the other side of switch to an electrical contact pad; and a separate contact trace connects the other side of switch to the electrical contact pad.

8. The device of claim 1, wherein the positive terminal of a battery is connected to the power input terminal and the negative terminal of battery 400 is connected the negative collection terminal;

functional elements can operate as user controllable on/off switches or they can be automatically turned on and off depending on the state of charge for the auxiliary battery.

9. The device of claim 8, wherein an assembled manual control switch is configured to control one or more of the internal electrical switching elements;

automatic functionality if desired is achieved through the microprocessor control unit (MCU) located on the printed circuit board assembly within the embodiment.

10. The device of claim 1, wherein the positive terminal of a battery is connected to the power input terminal and the negative terminal of battery is connected the negative collection terminal;

the positive terminal of a second battery is connected to the power input terminal;

functional elements operate as user controllable on/off switches or they can be automatically turned on and off depending on the state of charge for battery and/or battery.

11. The device of claim 10, wherein an assembled manual control switch is configured to control one or more of the internal electrical switching elements; and automatic functionality if desired is achieved through a microprocessor control unit (MCU) located on the printed circuit board assembly within the embodiment.

12. The device of claim 1, wherein the positive terminal of a battery is connected to the power input terminal;

the positive terminal of a second battery is connected to the power input terminal;

the positive terminal of a third battery is connected to the power input terminal;

functional elements can operate as user controllable on/off switches or they can be automatically turned on and off depending on the state of charge for a first battery and/or a second battery and/or a third battery.

13. The device of claim 12, wherein an assembled manual control switch is configured to control one or more of the internal electrical switching elements; and automatic functionality if desired is achieved through a microprocessor control unit (MCU) located on the printed circuit board assembly within the embodiment.

14. A flexible electrical system distribution, switching, and protection device, comprising a bottom cover snaps into a housing; terminal studs, pass through a circuit board assembly which fits within the housing; the terminal studs further thread into terminal housing nuts to fully secure the circuit board assembly inside the housing and ensure effective electrical contact between customer connected electrical cable ring terminals and the circuit board assembly through the terminal housing nuts; flange nuts are used to secure the attachment of electrical cable terminals; the programming cover assembles to the housing from a top side of the housing; low amperage input/output ring terminal screws assembled through a top of the circuit board assembly and assemble into square retaining nuts on a bottom side of the circuit board assembly; a manual override slide switch assembles to the housing from the side of the assembly and contains a magnet contained within a slide switch; and the slide switch and magnet are assembled from the an external of the device and transmit control signals magnetically through the bottom cover, and the manual slide switch is able to manually control the device without a physical connection through the housing or the bottom cover.

15. The device of claim 14, wherein one or more power connection terminal nuts pass through the enclosure base;

one or more power terminal studs thread into terminal nuts and secure user installed power cable ring terminals with locking nuts;

a dip switch cover seals the user accessible compartment for accessing dip switches within the enclosure; and control signal wire ring terminal attachment screws are accessible from the top of the device.

16. The device of claim 14, wherein the positive terminal of a battery is connected to the power input terminal;

the positive power connection for load devices are connected to the output terminal; and functional elements operate as a user controllable on/off switch or it can be automatically turned on and off depending on the state of charge of the auxiliary battery.

17. The device of claim 16, wherein an assembled manual control switch is configured to control the internal electrical switching element; and automatic functionality is achieved through a microprocessor control unit (MCU) located on the printed circuit board assembly.

18. The device of claim 14, wherein additional power terminals and switching devices are added, as well as additional manual on/off switches;

the positive terminal of a battery is connected to the power input terminal;

a first output power terminal is connected to a load device component;

a second output power terminal is connected to a second load device component;

functional elements operate as user controllable remote on/off switches or they can be automatically turned on and off depending on the state of charge of the auxiliary battery.

19. The device of claim 18, wherein manual control switches are configured to control one or more of the internal electrical switching elements; and automatic functionality is achieved through a microprocessor control unit (MCU) located on the printed circuit board assembly.

20. The device of claim 14, wherein the positive terminal of a battery is connected to the power input terminal;

the positive terminal of a second battery is connected to input terminal, while output power terminal is connected to a load device component;

functional elements operate as user controllable remote on/off switches or they can be automatically turned on and off depending on the state of charge of the auxiliary battery and/or the battery.

21. The device of claim 14, wherein additional power terminals and switching devices are added, as well as additional manual on/off switches;

the positive terminal of a battery is connected to the power input terminal;

the positive terminal of a second battery is connected to input terminal;

a first output power terminal is connected to a load device component;

a second output power terminal is connected to a second load device component;

functional elements operate as user controllable remote on/off switches or they can be automatically turned on and off depending on the state of charge of the auxiliary battery and/or the auxiliary battery.

\* \* \* \* \*